(12) United States Patent
Kim et al.

(10) Patent No.: US 7,751,223 B2
(45) Date of Patent: *Jul. 6, 2010

(54) MAGNETIC MEMORY DEVICES USING MAGNETIC DOMAIN MOTION

(75) Inventors: Tae-wan Kim, Yongin-si (KR); Kee-won Kim, Yongin-si (KR); Young-jin Cho, Yongin-si (KR); In-jun Hwang, Yongin-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 447 days.

This patent is subject to a terminal disclaimer.

(21) Appl. No.: 11/707,002

(22) Filed: Feb. 16, 2007

(65) Prior Publication Data

US 2007/0195588 A1 Aug. 23, 2007

(30) Foreign Application Priority Data

Feb. 17, 2006 (KR) ............... 10-2006-0015623

(51) Int. Cl.
*G11C 19/00* (2006.01)
(52) U.S. Cl. .................. 365/80; 365/158; 365/1; 365/29; 365/34; 365/85; 365/81
(58) Field of Classification Search ............... 365/158, 365/80, 1, 29, 34, 85, 81
See application file for complete search history.

(56) References Cited

U.S. PATENT DOCUMENTS 3,940,750 A * 2/1976 Voegeli ............... 365/32

| | | | | |
|---|---|---|---|---|
| 6,834,005 B1 * | 12/2004 | Parkin | ............... | 365/80 |
| 7,190,613 B2 * | 3/2007 | Nagase et al. | ............... | 365/171 |
| 7,236,386 B2 * | 6/2007 | Parkin | ............... | 365/80 |

(Continued)

FOREIGN PATENT DOCUMENTS

EP 1 320 102 A2 6/2003

(Continued)

OTHER PUBLICATIONS

U.S. Appl. No. 11/706,988.*

(Continued)

*Primary Examiner*—Hoai V Ho
*Assistant Examiner*—Kretelia Graham
(74) *Attorney, Agent, or Firm*—Harness, Dickey & Pierce, P.L.C.

(57) ABSTRACT

A magnetic memory device includes a recording layer, a reference layer, a first input portion and a second input portion. The recording layer has perpendicular magnetization direction and a plurality of magnetic domains, and the reference layer corresponds to a portion of the recording layer and has a pinned magnetization direction. The recording layer has a data storage cell wherein a plurality of data bit regions each including a magnetic domain are formed. The magnetic domain corresponds to an effective size of the reference layer. The first input portion inputs at least one of a writing signal and a reading signal. The second input portion is electrically connected to the recording layer and inputs a magnetic domain motion signal in order to move data stored in a data bit region of the recording layer to an adjoining data bit region.

33 Claims, 7 Drawing Sheets

U.S. PATENT DOCUMENTS

| | | | |
|---|---|---|---|
| 7,242,604 B2 * | 7/2007 | Klaeui et al. | 365/145 |
| 7,304,359 B2 * | 12/2007 | Kim et al. | 257/421 |
| 7,382,643 B2 * | 6/2008 | Ashida et al. | 365/158 |
| 7,477,539 B2 | 1/2009 | Kim et al. | |
| 2003/0117837 A1 * | 6/2003 | Park et al. | 365/158 |
| 2004/0251232 A1 | 12/2004 | Chen et al. | |
| 2004/0257719 A1 | 12/2004 | Ohba et al. | |
| 2005/0078511 A1 | 4/2005 | Parkin | |

FOREIGN PATENT DOCUMENTS

| | | |
|---|---|---|
| EP | 1 701 357 | 9/2006 |
| EP | 1 708 257 A1 | 10/2006 |
| KR | 10-2003-0048842 | 6/2003 |

OTHER PUBLICATIONS

U.S. Appl. No. 11/657,646.*

European Search Report dated Jul. 4, 2007 for counterpart European Patent Application No. 07102164.6-2210.

L. Gan et al., "Pulsed-Current-Induced Domain Wall Propagation in Permalloy Patterns Observed Using Magnetic Force Microscope", *IEEE Transactions on Magnetics*, vol. 36, No. 5, Sep. 2000.

Office Action for corresponding Korean Application No. 10-2006-0017238 dated Dec. 14, 2006.

Chun Byong et al., "Magnetization Switching and Tunneling Magnetoresistance Effects of Synthetic Antiferromagnet Free Layers Consisting of Amorphous NiFeSiB." Applied Physics Letters, AIP, American Institute of Physics, Melville, NY, vol. 87, No. 8, Aug. 18, 2005.

Office Action for corresponding European Application No. 06123193.2 dated Mar. 20, 2007.

Korean Office Action dated Dec. 13, 2006.

European Search Report dated Mar. 22, 2007.

* cited by examiner

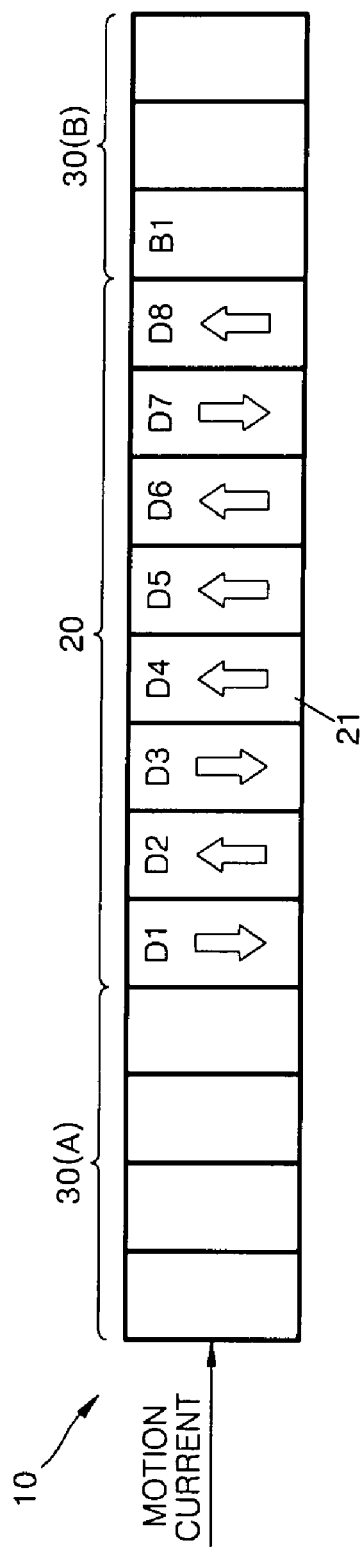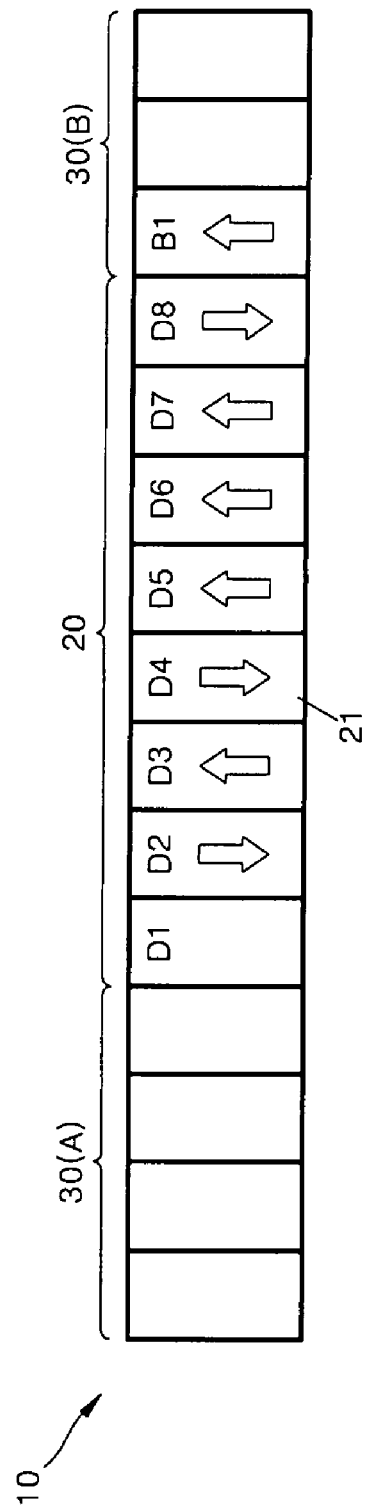

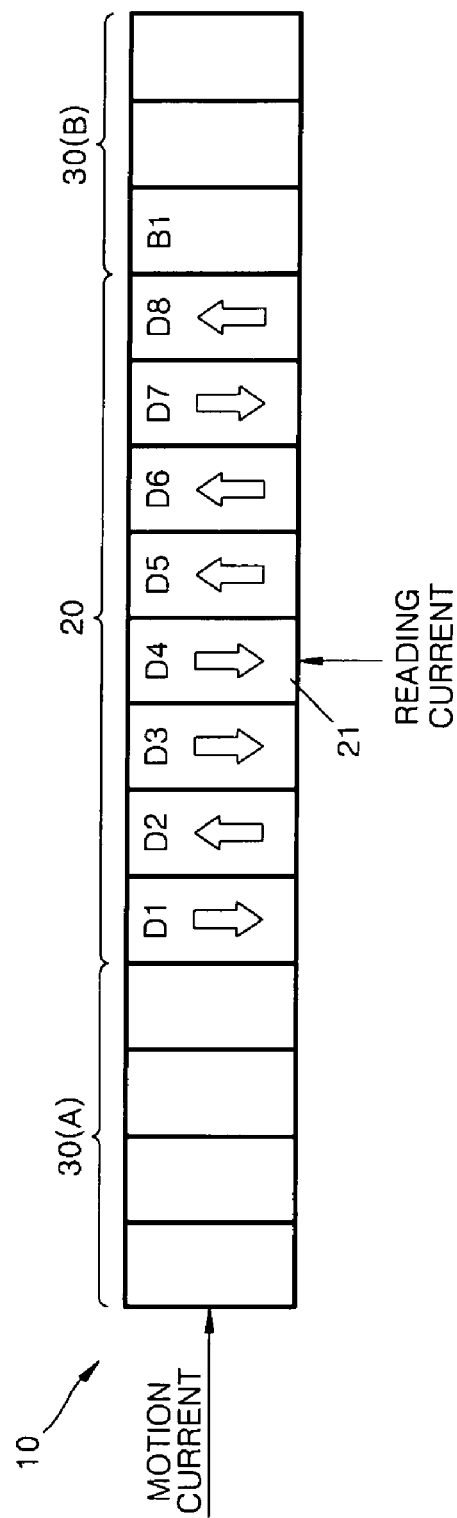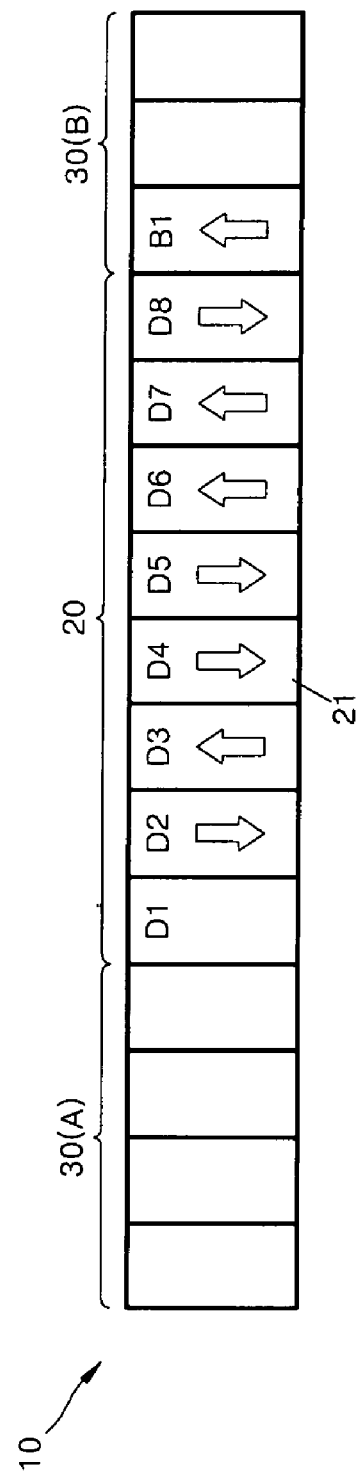

MAGNETIC MEMORY DEVICES USING MAGNETIC DOMAIN MOTION

PRIORITY STATEMENT

This non-provisional U.S. patent application claims priority under 35 U.S.C. §119 to Korean Patent Application No. 10-2006-0015623, filed on Feb. 17, 2006, in the Korean Intellectual Property Office (KIPO), the entire contents of which are incorporated herein by reference.

BACKGROUND

Description of the Related Art

Related art magnetic memories for storing information are classified as memory devices and storage devices. Memory devices focus on increasing solid state performance, while storage devices focus on increasing capacity.

A solid state magnetic random access memory (MRAM) is a non-volatile memory that uses a magnetic resistance effect based on spin-dependent conduction relative to nanomagnetic material. For example, MRAM may use giant magnetoresistance (GMR) or tunnel magnetoresistance (TMR) generated as spin, which is a degree of freedom of an electron and has a great influence on electron delivery.

GMR is a resistance difference generated when ferromagnetic materials having a non-magnetic material interposed there between have the same magnetization direction or different magnetization directions relative to an adjoining arrangement of ferromagnetic materials with a metallic non-magnetic material interposed there between. TMR refers to a resistance generated when two ferromagnetic materials have the same magnetization direction in an adjoining arrangement of ferromagnetic materials with an insulator interposed there between relative to two ferromagnetic materials have different magnetization directions. Because conventional MRAMs using GMR have a relatively small resistance difference resulting from a magnetization direction, a relatively large voltage difference may not be achieved. In conventional MRAMs, a size of a metal oxide semiconductor field effect transistor (MOSFET) including a GMR layer to form a cell may be relatively large, and may increase.

A conventional MRAM may include a transistor, which is a switching device, and a magnetic tunnel junction (MTJ) cell in which data is stored. The MTJ cell may include a pinned (or alternatively constant) ferromagnetic layer having a pinned (or alternatively constant) magnetization direction, a free ferromagnetic layer whose magnetization direction may be parallel or perpendicular to the pinned magnetization direction of the pinned ferromagnetic layer, and a non-magnetic layer arranged between the pinned ferromagnetic layer and the free ferromagnetic layer, magnetically separating the ferromagnetic layers. However, conventional MTJ cells store only one-bit data per cell, and thus, increases in the amount of data storage capacity of conventional MRAMs may be limited.

SUMMARY

Example embodiments relate to magnetic memories, for example, to magnetic memories for writing and/or reading multi-bit data (e.g., a plurality of data bits) using magnetic domain motion. Magnetic memory devices according to at least some example embodiments may include a plurality of magnetic domains, each of the plurality of magnetic domains having a perpendicular magnetization direction on a recording layer and storing and/or reading multi-bit data (e.g., a plurality of data bits) using a magnetic domain motion. Example embodiments may provide increased information storage capacity in magnetic memories such as the MRAM.

At least one example embodiment provides a magnetic memory device. According to at least this example embodiment, the magnetic memory device may include a recording layer, a reference layer, a first input portion and a second input portion. The recording layer may include a plurality of magnetic domains each having a switchable (or variable) perpendicular magnetization direction. The reference layer may correspond to a portion of the recording layer and may include a pinned (or constant) magnetization direction. A data storage cell for storing an array of a data bit may include a magnetic domain corresponding to an effective area of the reference layer may be arranged on the reference layer. The first input portion may be electrically connected to at least one data bit region of the data storage cell and to the reference layer, and may input at least one of a writing signal and a reading signal. The second input portion may be electrically connected to the recording layer and may input a magnetic domain motion signal to move data stored in the data bit region of the recording layer to an adjoining data bit region.

According to at least some example embodiments, the recording layer may be a magnetic domain strip formed of an amorphous magnetic material having a perpendicular magnetization direction. The recording layer may include an alloy of a rare earth element-transition metal. The rare earth element used for forming the recording layer may be at least one selected from the group consisting of Tb, Gd and Eu. The transition metal used for forming the recording layer may be at least one selected from the group consisting of Co, Fe, Mn and Ni. The reference layer may have one of a perpendicular magnetization direction and an in-plane magnetization direction. The reference layer may be formed of the same material as that of the recording layer. The data bit region may consist of a single magnetic domain.

According to at least some example embodiments, the memory device may further include a non-magnetic layer arranged between the reference layer and the recording layer. The non-magnetic layer may be one of a conduction layer and an insulation layer serving as a tunneling barrier. The writing signal may be a pulse type switching current. The reading signal may be a pulse current smaller than the switching current. The inputting of at least one of the switching current and the reading pulse current, and the inputting of the magnetic domain motion signal may be performed in turns (or alternately), so that a data storing or reading operation and a magnetic domain motion operation may be performed in turns (or alternately). A magnetic domain motion may be performed by a data bit region unit. A magnetic domain motion may be performed by a data bit region unit, and a data storing or reading operation and a magnetic domain motion operation are performed in turns.

According to at least some example embodiments, the memory device may further include a buffer cell arranged on one side of the data storage cell and adjoining the data storage cell to store data moved to the outside of a region of the data storage cell due to a magnetic domain motion. A plurality of data storage cells may be formed, and the buffer cell may be located between two adjacent data storage cells. At least one first input portion may be formed per data storage cell. According to at least one example embodiment, a plurality of data storage cells may be formed in an array, and at least one first input portion may be formed per data storage cell.

According to at least one other example embodiment, a recording layer for storing multi-bit data may include a plurality of magnetic domains. Each of the plurality of magnetic domains may have a switchable magnetization direction. The recording layer may include a material having a composition of TbFeCo. The material may have a composition ration of ratio of Tb20Fe70Co10, Tb23Fe67Co10 or Tb16Fe74Co10.

According to at least one other example embodiment, a reference layer corresponding to a portion of a recording layer may store multi-bit data. The reference layer may have a pinned magnetization direction, and include a material having a composition of TbFeCo. For example, the material may have a composition ratio Tb20Fe70Co10, Tb23Fe67Co10, Tb18Fe72Co10 or Tb16Fe74Co10.

At least one other example embodiment provides a method for storing multi-bit data in a magnetic memory device. The magnetic memory device may include at least a recording layer and a reference layer. The recording layer may include a plurality of data bit regions. According to at least this example embodiment, a reference magnetization direction of a first portion of the recording layer in which to store data may be designated (or established) in response to a writing signal input to the reference layer and the recording layer. The first portion of the recording layer may correspond to the reference layer. Multi-bit data may be stored in the first portion of the recording layer by reversing or maintaining the magnetization direction of the first portion of the recording layer based on the writing signal. The reference magnetization direction may be perpendicular or parallel.

According to at least this example embodiment, the stored data may be moved to a second portion of the recording layer in response to a motion signal, and multi-bit data may be stored in the first portion of the recording layer by reversing or maintaining the magnetization direction of the first portion of the recording layer based on the writing signal. The second portion may be adjacent to the first portion.

At least one other example embodiment provides a method for reading multi-bit data from a magnetic memory device including at least a recording layer and a reference layer. The recording layer may include a plurality of data bit regions. According to at least this example embodiment, a reading signal may be applied to the reference layer and the recording layer. Multi-bit data stored in a portion of the recording layer may be read based on a change in magnetization direction of the portion of the recording layer in response to the applied reading signal. The portion of the recording layer may be located at a portion of the recording layer corresponding to the location of the reference layer. The reading current, writing current and/or the motion signal may be a pulse current.

BRIEF DESCRIPTION OF THE DRAWINGS

Example embodiments will become more apparent by describing in detail the example embodiments shown in the attached drawings in which:

FIGS. 4A through 4C are views illustrating when a switching current is applied to a fourth data bit region of a magnetic memory according to an example embodiment;

FIGS. 5A and 5B are views illustrating when a pulse current for reading is applied to a fourth data bit region of FIG. 1;

DETAILED DESCRIPTION OF EXAMPLE EMBODIMENTS

Figure 1:
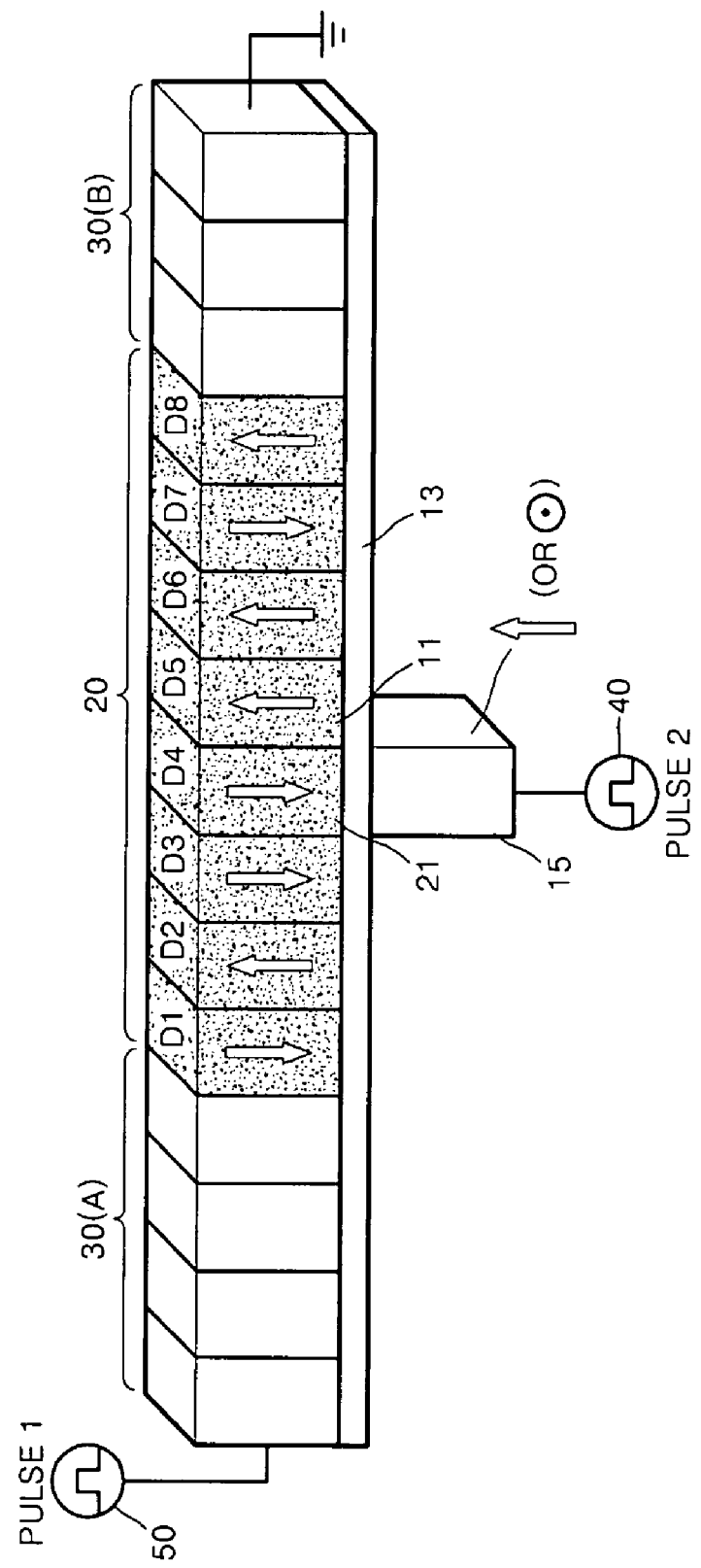
FIG. 1 is a schematic view illustrating a magnetic memory including a data storage cell according to an example embodiment.

Various example embodiments of the present invention will now be described more fully with reference to the accompanying drawings in which some example embodiments of the invention are shown. In the drawings, the thicknesses of layers and regions are exaggerated for clarity.

Detailed illustrative embodiments of the present invention are disclosed herein. However, specific structural and functional details disclosed herein are merely representative for purposes of describing example embodiments of the present invention. This invention may, however, may be embodied in many alternate forms and should not be construed as limited to only the embodiments set forth herein.

Accordingly, while example embodiments of the invention are capable of various modifications and alternative forms, embodiments thereof are shown by way of example in the drawings and will herein be described in detail. It should be understood, however, that there is no intent to limit example embodiments of the invention to the particular forms disclosed, but on the contrary, example embodiments of the invention are to cover all modifications, equivalents, and alternatives falling within the scope of the invention. Like numbers refer to like elements throughout the description of the figures.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of example embodiments of the present invention. As used herein, the term "and/or" includes any and all combinations of one or more of the associated listed items.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between", "adjacent" versus "directly adjacent", etc.).

The terminology used herein is for the purpose of describing particular embodiments only and is not intended to be limiting of example embodiments of the invention. As used herein, the singular forms "a", "an" and "the" are intended to include the plural forms as well, unless the context clearly indicates otherwise. It will be further understood that the terms "comprises", "comprising,", "includes" and/or "including", when used herein, specify the presence of stated features, integers, steps, operations, elements, and/or components, but do not preclude the presence or addition of one or more other features, integers, steps, operations, elements, components, and/or groups thereof.

It should also be noted that in some alternative implementations, the functions/acts noted may occur out of the order noted in the figures. For example, two figures shown in succession may in fact be executed substantially concurrently or may sometimes be executed in the reverse order, depending upon the functionality/acts involved.

FIG. 1 is a schematic view illustrating a data storage cell and a magnetic memory having the same according to an example embodiment.

Referring to FIG. 1, a data storage cell 20 may include a recording layer 11 and a reference layer 15 corresponding to a portion of the recording layer 11. The recording layer 11 may have a switchable (or variable) magnetization direction and may store a plurality of data bits. The recording layer 11 may be formed of a plurality of magnetic domains having a perpendicular magnetization direction. A non-magnetic layer 13 may be formed between the reference layer 15 and the recording layer 11. Although the non-magnetic layer 13 is formed over the entire surface of the recording layer 11 in FIG. 1, the non-magnetic layer 13 may be formed on a portion of the recording layer 11. For example, the non-magnetic layer 13 may be formed on only an upper surface of the reference layer 15.

The recording layer 11 may have a switchable (variable) perpendicular magnetization direction and may include magnetic domain walls. An array of magnetic domains may exist in the recording layer 11 by virtue of these magnetic domain walls. The recording layer 11 may be formed to store multi-bit data (e.g., a plurality of data bits in an array). To do so, the recording layer 11 may be formed in a magnetic domain strip.

In the data storage cell 20, data may be stored or stored data may be read by a unit of area of the recording layer 11 that corresponds to an effective size of the reference layer 15. The effective size of the reference layer 15 may determine a size of a one data bit region of the recording layer 11. As a result, the recording layer 11 may be formed to have the same or substantially the same length as a multiple of the number of data bit regions with respect to the effective size of the reference layer 15. For example, the length of the recording layer 11 may be the same or substantially the same as a width of magnetic domain motion. Accordingly, an array of data bit regions may be provided in the recording layer 11 by a unit having an effective size of the reference layer 15, so that multi-bit data (e.g., a plurality of data bits) may be stored in an array.

In another example, when a single magnetic domain is present within one data bit region, a magnetic domain formed in the recording layer 11 may be formed to have a size greater than or equal to the effective size of the reference layer 15.

The recording layer 11 may be formed of a perpendicular magnetic anisotropic material, for example, an amorphous magnetic material (e.g., an amorphous ferromagnetic material, amorphous ferromagnetic material or the like) so that the recording layer 11 may have a perpendicular easy axis, and thus, have a perpendicular magnetization direction. The recording layer 11 may be formed as a magnetic domain strip, or the like. For example, the recording layer 11 may be formed of a material including an alloy of a rare earth element-transition metal, such as, an element selected from the group consisting of or including Tb, Gd, Eu or the like. The transition metal used for forming the recording layer 11 may be selected from the group consisting of or including Co, Fe, Mn, Ni or the like. However, any suitable amorphous magnetic material may be used to form the recording layer 11.

In at least one example embodiment, the recording layer 11 may be formed of, for example, TbFeCo to have a perpendicular easy axis. However, example embodiments are not limited to this alloy.

When the recording layer 11 of a magnetic domain strip having a perpendicular magnetization direction is formed using the amorphous magnetic material, an artificial magnetic domain forming process may not be needed, and a magnetic domain corresponding to a data bit region having a smaller or relatively small size, for example, a nanoscale size, may be formed (e.g., naturally formed).

In the case of a soft magnetic material having an in-plane magnetization direction, a magnetic domain may be less stable (e.g., unstable) and may be divided into multi-domains when the size of a magnetic domain is reduced and/or becomes relatively small. Therefore, when the soft magnetic material having in-plane magnetization direction is used, forming (e.g., naturally forming) one data bit region storing one-bit data using a single domain may be more difficult. Therefore, when a recording layer 11 is formed using the soft magnetic material having an in-plane magnetization direction, notches may artificially form in the recording layer 11 such that one magnetic domain is present in one data bit region, and thus, an array of a plurality of data bit regions may be formed in the recording layer 11.

On the other hand, according to the data storage cell 20, because the recording layer 11 may be formed of an amorphous magnetic material so that the recording layer 11 may have a perpendicular magnetization direction, one magnetic domain per one data bit region may be formed even when the size of the magnetic domain is reduced, for example, to a nanoscale. As a result, a magnetic domain corresponding to a data bit region having a reduced and/or relatively small size (e.g., a nanoscale size) may be formed (e.g., naturally formed).

Moreover, when the recording layer 11 is formed of an amorphous magnetic material (e.g., a material including an alloy of a rare earth element-transition metal) having a perpendicular magnetization direction, the recording layer 11 may have higher or relatively high coercive force as compared to that associated with a softer magnetic material. Therefore, the magnetic domain may be formed (e.g., naturally formed) to a size corresponding to an effective size of the reference layer 15 and the magnetic domain may be more stable.

The reference layer 15 may be a pinned layer having a pinned (or alternatively constant) magnetization direction, and may have an effective size corresponding to one data bit region of the recording layer 11. The reference layer 15 may have one of a pinned in-plane magnetization direction and a pinned perpendicular magnetization direction. For example, the reference layer 15 may be formed of a more generic or general ferromagnetic material so that the reference layer may have a particular in-plane magnetization direction.

In another example, the reference layer 15 may be formed of the same or substantially the same magnetic material (e.g., an alloy of a rare earth element-transition metal) as the recording layer 11 so that the reference layer 15 may have a perpendicular magnetization direction. In this example, the reference layer 15 may be formed of TbFeCo. Because the recording layer 11 has a switchable (or variable) magnetization direction and the reference layer 15 has a pinned (or constant) magnetization direction, the recording layer 11 may have a lower or relatively low coercive force, and the reference layer 15 may have a higher or relatively high coercive force. The coercive force may be controlled, for example, by changing composition ratios of elements used for forming the reference layer 15 and the recording layer 11.

Figure 2:
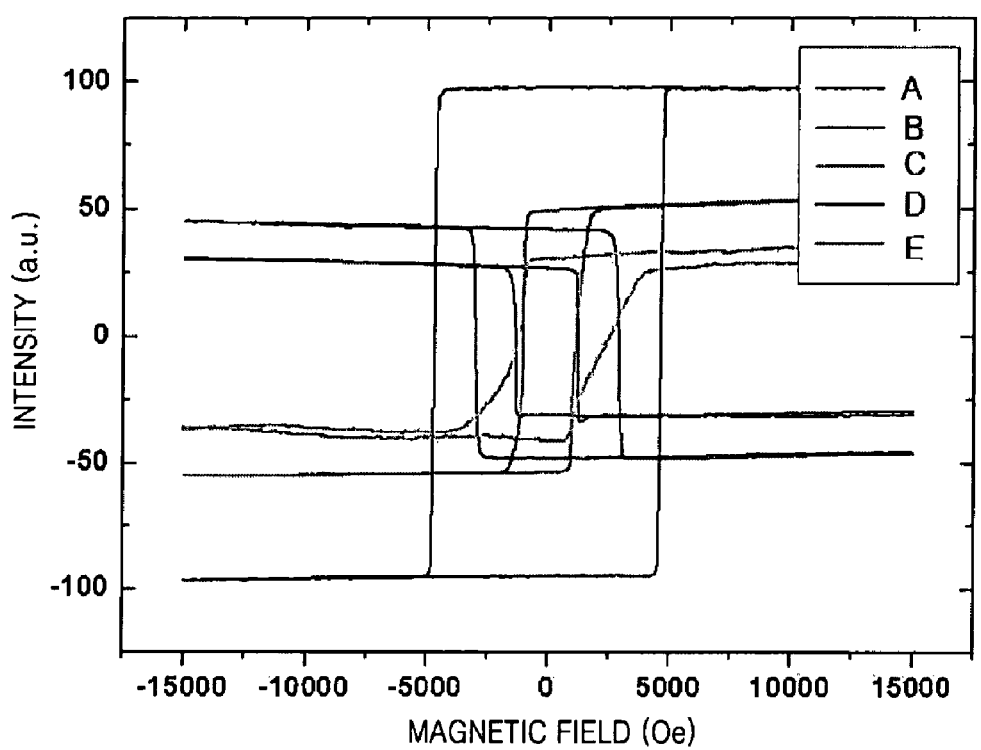
FIG. 2 is a view illustrating transmitted light intensity measured when a perpendicular magnetic field is applied to five samples A, B, C, D and E of a TbFeCo material having different composition ratios.

FIG. 2 is a view illustrating transmitted light intensity measured when a perpendicular magnetic field is applied to five samples A, B, C, D and E of a TbFeCo material having different composition ratios. The perpendicular magnetic field was applied using a magnetic optical kerr effect (MOKE).

As shown in FIG. 2, a horizontal axis represents a perpendicular magnetic field (unit: Oe), and a vertical axis represents transmitted light intensity (unit: arbitrary unit (a.u.)).

FIG. 2 shows results obtained by measuring light intensity as a polarization of transmitted light changes depending on a magnetization direction. The results shown in FIG. 2 are obtained by applying a perpendicular magnetic field and show that a material TbFeCo has a perpendicular magnetization characteristic (e.g., a perpendicular easy axis). The curve shown in FIG. 2 corresponds to a magnetic hysteresis curve and shows that a sample D having a larger or relatively large interval between curves may have a higher or relatively high coercive force. The sample D may be used for the reference layer 15. The rest of samples A, B, C and E may have a lower coercive force compared to the sample D, and thus, may be used for the recording layer 11.

In this example, samples A and B are samples including a TbFeCo layer formed to a thickness of 20 nm and a W layer formed to a thickness of 5 nm on the TbFeCo layer (No-under layer/TbFeCo (20 nm)/W (5 nm)). The samples C and D are samples including an Al layer formed to a thickness of 10 nm, a TbFeCo layer formed to a thickness of 20 nm on the Al layer and a W layer formed to a thickness of 5 nm on the TbFeCo layer (Al (10 nm)/TbFeCo (20 nm)/W (5 nm)). Sample E includes an Al layer formed to a thickness of 10 nm, a TbFeCo layer formed to a thickness of 100 nm on the Al layer and a W layer formed to a thickness of 2-3 nm on the TbFeCo layer (Al (10 nm)/TbFeCo (100 nm)/W (2-3 nm)). The element composition ratios of the samples A, B, C, D and E are A:$Tb_{20}Fe_{70}Co_{10}$, B:$Tb_{23}Fe_{67}Co_{10}$, C:$Tb_{20}Fe_{70}Co_{10}$, D:$Tb_{18}Fe_{72}Co_{10}$, and E:$Tb_{16}Fe_{74}Co_{10}$.

Referring still to FIG. 2, because the strength of the coercive force may be changed by changing the element composition ratios of TbFeCo, each of the recording layer 11 and the reference layer 15 may be formed of the same or substantially the same material. The element composition ratios of TbFeCo may be improved (e.g., optimized) so that the recording layer 11 has a lower or relatively low coercive force, while the reference layer 15 has a higher or relatively high coercive force.

Figure 3:
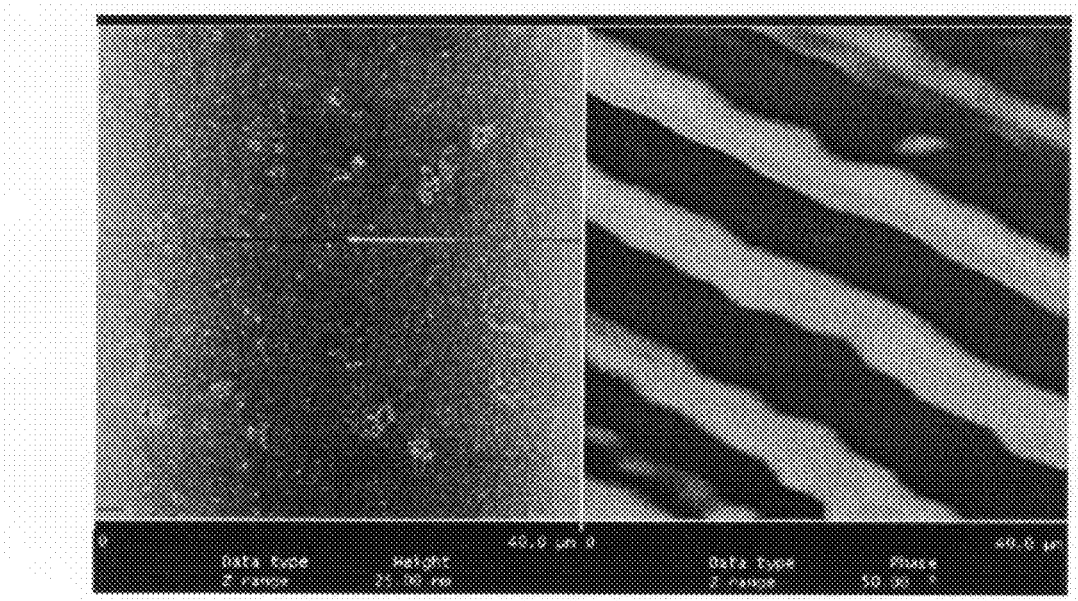
FIG. 3 illustrates photos obtained by performing microscopy using a microscope on a sample where a $Tb_{20}Fe_{70}Co_{10}$ layer is formed to a thickness of 20 nm and a W layer is formed to a thickness of 5 nm on the $Tb_{20}Fe_{70}Co_{10}$ layer.

FIG. 3 are photos illustrating magnetic domains formed in a sample (No-under layer/TbFeCo (20 nm)/W (5 nm)). As shown in FIG. 3, where a $Tb_{20}Fe_{70}Co_{10}$ layer is formed to a thickness of 20 nm and a W layer is formed to a thickness of 5 nm on the $Tb_{20}Fe_{70}Co_{10}$ layer. The left side of FIG. 3 shows an atomic force microscopy (AFM) photo of the sample, and the right side of FIG. 3 shows a magnetic force microscopy (MFM) photo of the sample. In the sample shown in FIG. 3, a perpendicular coercive force $Hc_\perp$ is 1.66 kOe, and a saturated magnetization force Ms is 280 emu/cc.

In an MFM test, measurement is performed under conditions where a restrictive magnetic field is applied to the entire sample and then the applied magnetic field is removed (zero-field) to achieve a natural state. In the MFM photo, the brighter portion is a magnetic domain that has been magnetized in a direction extending out of the paper (referred to as a first magnetic domain), and the darker portion is a magnetic domain that has been magnetized in a direction entering the paper (referred to as a second magnetic domain). Because the first and second magnetic domains are formed in turns (or alternately), the above-described recording layer 11 may be obtained by forming an array of these magnetic domains as a magnetic domain strip. Referring to FIG. 3, each of the first and second magnetic domains may not be divided into multiple domains, but may be maintained as a single domain.

Referring back to FIG. 1, the data storage cell 20 according to an example embodiment may further include a non-magnetic layer 13 arranged between the reference layer 15 and the recording layer 11. The non-magnetic layer 13 may be one of a conductive or conduction layer (e.g., Cu or the like) and an insulating or insulation layer (e.g., an aluminum oxide layer or the like) serving as a tunneling barrier.

In FIG. 1, a plurality of data bit regions each having a size corresponding to a size of the reference layer 15 may be formed so that the data storage cell 20 may store multi-bit data. For example, eight data bit regions may be formed so that the data storage cell 20 may store 8-bit data. However, the number of data bit regions may be increased or decreased as desired. In FIG. 1, D1, D2, D3, D4, D5, D6, D7 and D8 are first to eighth data bit regions constituting the data storage cell 20.

In a magnetic memory device 10, according to an example embodiment, each of the plurality of data bit regions D1, D2, D3, D4, D5, D6, D7 and D8 may be formed of a single magnetic domain where a magnetic domain wall is present at both edges of the magnetic domain. The magnetic memory device 10 having the data storage cell 20 will be described in more detail below.

Referring still to FIG. 1, the magnetic memory device 10 may include the data storage cell 20 for storing multi-bit data (e.g., a plurality of data bits), at least one first input portion 40 and a second input portion 50. The at least one input portion 40 may input at least one (PULSE 2) of a writing signal and a reading signal, and the second input portion 50 may input a magnetic domain motion signal (PULSE 1).

An adjoining magnetic domain of the recording layer 11 may be moved and a data bit (e.g., '0' or '1') may be recorded in a particular or specific magnetic domain, by reversing a magnetization direction of one of the magnetic domains, for example, the particular magnetic domain located at a particular or specific position corresponding to the reference layer 15. The magnetization direction may be reversed using spin transfer torque (e.g., current induced magnetic switching (CIMS)), which may be performed according to a magnetic domain motion signal (PULSE 1) applied through the second input portion 50 and a writing current signal (e.g., PULSE 2 (WRITING) in FIG. 6) applied, in synchronization with this magnetic domain motion signal (PULSE 1), through the first input portion 40.

Figure 6:
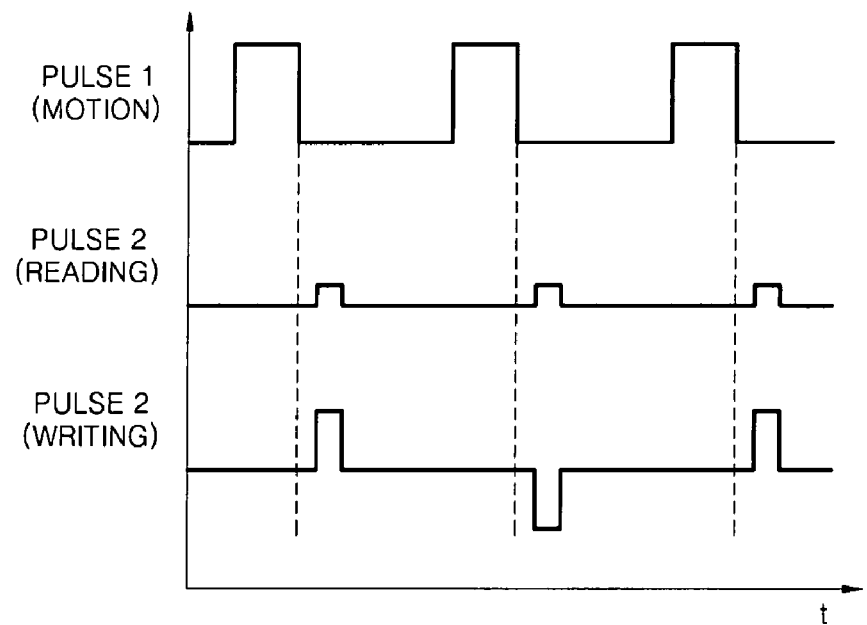
FIG. 6 is a schematic graph illustrating a magnetic domain motion current PULSE 1 (MOTION), a reading pulse current PULSE 2 (READING), and a writing switching current PULSE 2 (WRITING) applied to a magnetic memory device according to an example embodiment.

Additionally, in the magnetic memory device 10, a magnetic domain may be moved and data stored in a magnetic domain may be read by applying (e.g., using spin tunnelling) a reading signal (e.g., a reading pulse signal) to the recording layer 11 and the reference layer 15, according to a magnetic domain motion signal (PULSE 1) applied through the second input portion 50, and a reading signal (e.g., PULSE 2 (READING) in FIG. 6) applied, in synchronization with this motion signal (Pulse 1), through the first input portion 40. In FIG. 1, PULSE 2 may be a writing signal or reading signal.

The first input portion 40 may be electrically connected to at least one data bit region of the recording layer 11 and the reference layer 15. FIG. 1 shows the first input portion 40 electrically connected to the reference layer 15 and a single data bit region (e.g., data bit region 21) of the recording layer 11 located on the reference layer 15.

In example operation, a writing signal may be input to the recording layer 11 and the reference layer 15 through the first input portion 40, and a magnetization direction of the data bit region 21 of the recording layer 11 located on the reference layer 15 may be designated according to the input writing signal. In FIG. 1, the data storage cell 20 may have an array of first to eighth data bit regions D1, D2, D3, D4, D5, D6, D7 and D8, and the data bit region 21 electrically connected to the first input portion 40 may become the fourth data bit region D4 located on the reference layer 15.

When a writing signal is input through the first input portion 40, a magnetization direction of the fourth data bit region D4 may be determined according to the input writing signal. For example, when the fourth data bit region D4 has a first magnetization direction, the magnetization direction of the fourth data bit region D4 may be reversed or maintain the first magnetization direction depending on the applied writing signal. The magnetization direction designated in this manner represents a recorded data bit.

Referring to FIG. 6, the writing signal may be a pulse-type switching current. A magnetization direction of data bit region 21 (e.g., the fourth data bit region D4 of the recording layer 11) may be selectively switched depending on the polarity of the switching current, and a data bit (e.g., '0' or '1') may be stored in the data bit region 21.

For example, assuming that the reference layer 15 has a perpendicular magnetization direction and a data bit is designated as '0' when a perpendicular magnetization direction of data bit region 21 becomes the same as (or parallel to) the magnetization direction of the reference layer 15, a data bit may be designated as '1' when the data bit region 21 has a perpendicular magnetization direction opposite to the perpendicular magnetization direction of the reference layer 15 in response to an applied switching current having an opposite polarity. Consequently, data may be stored by changing the polarity of the switching current to allow the magnetization direction of the data bit region 21 to be the same as or opposite to that of the reference layer 15. In FIG. 1, arrows marked on the first to eighth data bit regions D1, D2, D3, D4, D5, D6, D7 and D8 represent perpendicular magnetization directions.

In this example, assuming the reference layer 15 has an in-plane magnetization direction (e.g., a magnetization direction directed to the right of FIG. 1), a data bit is designated as '0' when a switching current is applied and a perpendicular magnetization direction of a data bit region 21 is directed 'up', while a data bit may be designated as '1' when a switching current having an opposite polarity is applied and the data bit region 21 has a perpendicular magnetization direction directed 'down'. Consequently, data may be stored by changing the polarity of a switching current to allow the perpendicular magnetization direction of the data bit region 21 to become 'up' or 'down'. In FIG. 1, arrows marked on the first to eighth data bit regions D1, D2, D3, D4, D5, D6, D7 and D8 represent perpendicular magnetization directions.

In this example, whether the reference layer 15 has a perpendicular magnetization direction or an in-plane magnetization direction, whether a perpendicular magnetization direction is 'up' or 'down' when the reference layer 15 has a perpendicular magnetization direction and/or whether an in-plane magnetization direction is 'right' or 'left' when the reference layer 15 has an in-plane magnetization direction may be determined, for example, arbitrarily and/or in advance. Therefore, assuming a data bit is designated as '0' and '1' when the perpendicular magnetization direction of the recording layer 11 is 'up' and 'down', respectively, with respect to a particular magnetization direction of the reference layer 15, desired data may be stored by switching the perpendicular magnetization direction of the data bit region 21 contained in the recording layer 11.

On the other hand, to read stored data, a reading signal (e.g., a reading pulse current illustrated in FIG. 6), may be input to the data bit region 21 of the recording layer 11 and the reference layer 15 through the first input portion 40. The reference layer 15, the data bit region 21 of the recording layer 11 located on the reference layer 15 and the non magnetic layer 13 located there between may constitute a magnetic tunnel junction (MTJ) cell. Therefore, the intensity of passing current or resistance changes may depend on a perpendicular magnetization direction of the data bit region 21 of the recording layer 11 with respect to the magnetization direction of the reference layer 15. Data may be read using such a change. In this example, a separate reference layer and an input portion may be provided to read data.

Referring to FIG. 6, the reading pulse current may be a pulse current smaller than the switching current for writing. This reading pulse current may be applied in synchronization with the domain motion signal. Therefore, stored data according to a magnetization direction of data bit region 21 located on the reference layer 15 may be read.

Referring back to FIG. 1, the second input portion 50 may be electrically connected to the recording layer 11 to move data (e.g., in-plane magnetization or perpendicular magnetization) stored in a data bit region of the recording layer 11 to an adjoining (or alternatively adjacent) data bit region. A magnetization direction of a magnetic domain may be moved to an adjoining magnetic domain according to a motion signal (PULSE 1) input through the second input portion 50. Accordingly, bit data contained in a data bit region may be moved to an adjacent data bit region. Such a motion may be referred to as magnetic domain motion.

The magnetic domain motion signal (PULSE 1) may be a pulse current input with a constant or substantially constant period. The magnetic domain motion signal (PULSE 1) may be input so that the magnetic domain motion is performed by a data bit region unit including at least one magnetic domain. In this example, because the magnetic domain motion moves a magnetization direction of a magnetic domain to an adjoining magnetic domain, the motion signal (PULSE 1) may be continuously applied while the magnetic domain motion is performed by a data bit region unit, and periodically applied while the magnetic domain motion is performed by a data bit region unit.

A writing switching current or reading switching current, and a motion signal may be input, for example, in turns (or alternately). Therefore, a data writing operation or stored data reading operation, and a magnetic domain motion may be performed in turns (or alternately), and a plurality of data bits may be recorded (e.g., sequentially recorded) in or read (e.g., sequentially read) from a plurality of data bit regions.

According to at least some example embodiments, the magnetic memory device 10 may further include buffer cell 30 adjoining the data storage cell 20 to at least one side of the data storage sell 20 to store data moved to the outside of a region of the data storage cell 20 as a result of magnetic domain motion. For example, when the data storage cell 20 has n data bit regions, the buffer cell 30 may have at least n or n-1 data bit regions. The number of the data bit regions contained in the buffer cell 30 may be at least the same as the number of the data bit regions contained in the data storage cell 20, or alternatively, may be smaller (e.g., a relatively small number such as about 1 less) than the number of the data bit regions. Physical properties of the recording layer 11 located in the data storage cell 20 and the buffer cell 30 may be the same or substantially the same. FIG. 1 shows an example in which a central portion of the recording layer 11 is used as the data storage cell 20 and both side portions of the recording layer 11 are used as the buffer cell 30. Because a writing or reading operation may not be performed directly on the buffer cell 30, the buffer cell 30 may include only the recording layer 11, or include a layer structure including (or consisting of) the recording layer 11 and the non-magnetic layer 13 located beneath it. In the magnetic memory device 10, the buffer cell 30 may have the same or substantially the same layer structure as that of the data storage cell 20, for example, a layer structure including the reference layer 15, even without a signal input to the reference layer 15 of the buffer cell 30.

In FIG. 1, a data writing or reading operation may be performed on a fourth data bit region D4, which is a fourth region of eight data bit regions D1, D2, D3, D4, D5, D6, D7 and D8 of the data storage cell 20, and a first portion A and a second portion B of the buffer cell 30 may be provided on respective sides of the data storage cell 20. FIG. 1 shows the first portion A including four data bit regions arranged to the left side of the data storage cell 20, and the second portion B including three data bit regions to the right side of the data storage cell 20. For data contained in eight data bit regions D1, D2, D3, D4, D5, D6, D7 and D8 of the data storage cell 20, a data reading operation may begin with the eighth data bit region D8 moved to the left so that data of the eighth data bit region D8 is positioned at a fourth data bit region D4, and a motion operation and a reading operation may be performed in turns (or alternately) while the data is moved to the right, so that the data contained in the eight data bit regions D1, D2, D3, D4, D5, D6, D7 and D8 may be read (e.g., sequentially).

Though FIG. 1 shows an example in which the reference layer 15 is formed on a middle portion of the data storage cell 20, and thus, a data writing or reading operation is performed on the middle portion of the data storage cell 20, example embodiments are not limited to this particular example and various modifications may be made.

For example, a data writing or reading operation may be performed on a first data bit region D1 of the data storage cell 20, and the buffer cell 30 having greater than, equal to or less than the number of the data bit regions contained in the data storage cell 20 may be formed adjacently to a data bit region of the data storage cell 20 where the data writing or reading operation starts (e.g., when the data writing or reading operation starts at a first data bit region D1, the left side of the first data bit region D1, and when the data writing or reading operation starts at an eighth data bit region D8, the right side of the eighth data bit region D8) or may be formed at both sides of the data storage cell 20. Because this modification may be deduced from the structure shown in FIG. 1, detailed illustration thereof will be omitted for the sake of brevity.

When the buffer cell 30 is formed on the right or left of the data storage cell 20, data contained in the data storage cell 20 may be moved to the buffer cell 30, and the data reading operation may be performed. A magnetic domain motion performed during the data reading operation and a magnetic domain motion performed during the data wiring operation may be performed in the same direction. Also, the data reading operation may be performed (e.g., concurrently or simultaneously) while data contained in the data storage cell 20 is moved to the buffer cell 30. In this example, a magnetic domain motion performed during the data reading operation and a magnetic domain motion performed during the data writing operation may be performed in mutually opposite directions.

When n data bits are stored in the data storage cell 20, the number of data bit regions of the buffer cell 30 may be one data bit region smaller than that of the data storage cell 20. For example, the buffer cell 30 may be formed to store (n-1) data bits. Because one data bit may be stored in a data bit region, (e.g., data bit region 21 of the data storage cell 20 where the data writing or reading operation is performed), the buffer cell 30 may store (e.g., temporarily store) (n-1) data bits.

When the buffer cells 30 are formed on both sides of the data storage cell 20, data contained in the data storage cell 20 may be read while a magnetic domain motion is performed without moving the data to the buffer cell 30. In this example, a magnetic domain motion performed during the data reading operation and a magnetic domain motion performed during the data writing operation may be performed in mutually opposite directions. Even in this example, when n data bits are stored in the data storage cell 20, the number of data bit regions stored in the buffer cells 30 formed on both sides of the data storage cell 20 may be one data bit region smaller than that of the data storage cell 20.

Although the magnetic memory device 10 according to at least some example embodiments may have a buffer cell 30 adjoining the data storage cell 20 in the above descriptions, the magnetic memory device 10 may include (or alternatively consist of) the data storage cell 20 without the buffer cell 30. In this example embodiment, the data storage cell 20 may further include data bit regions serving as a buffer in addition to the data bit regions for storing a number of bits. For example, when n data bits are to be stored, the data storage cell 20 may include at least 2n or 2n-1 data bit regions.

In the magnetic memory device 10 having the above-described structure according to an example embodiment, a writing switching current or reading switching current, and a motion current may be input in turns (or alternately). Therefore, a data writing operation or stored data reading operation, and a magnetic domain motion may be performed in turns (or alternately). A data writing operation or data reading operation in the magnetic memory device 10 according to an example embodiment will be described below with reference to FIGS. 4A through 4C, and 5A and 5B.

Figure 4A:
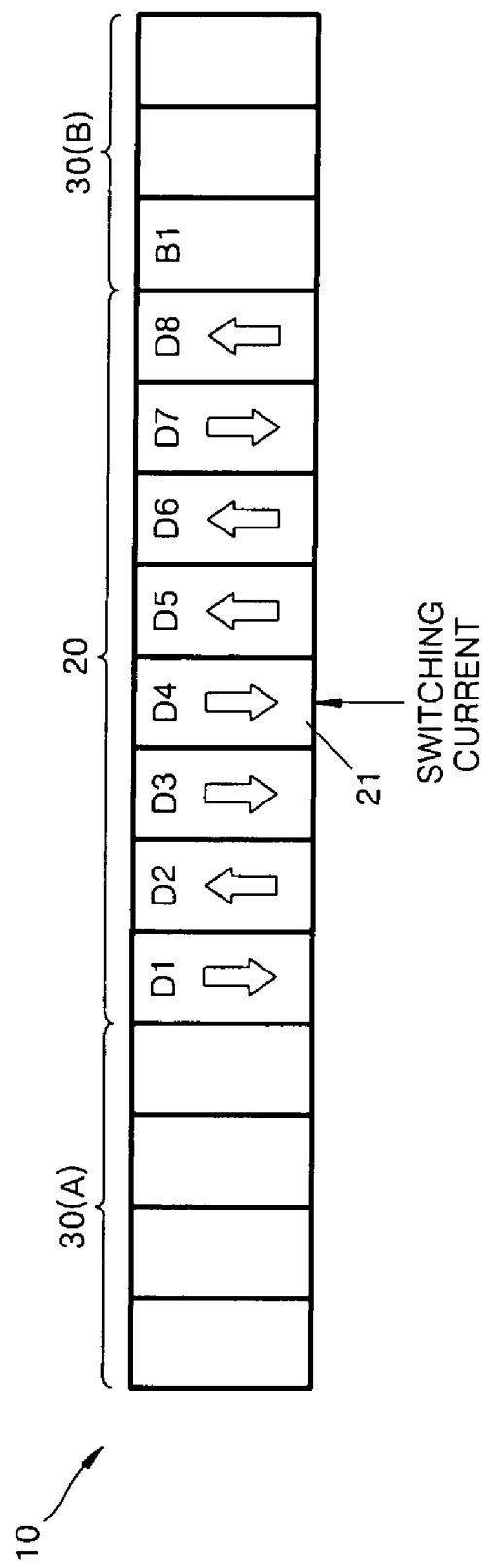

FIGS. 4A through 4C are views illustrating when a switching current is applied to a fourth data bit region D4 (e.g., data bit region 21) of FIG. 1 reversing a perpendicular magnetization direction of the fourth data bit region D4, and the reversed perpendicular magnetization direction of the fourth data bit region D4 is moved to a fifth adjoining data bit region D5 by a motion current. FIGS. 5A and 5B are views illustrating when a reading pulse current is applied to a fourth data bit region D4 (e.g., data bit region 21) of FIG. 1 to read the fourth data bit region D4, and the perpendicular magnetization direction of the fourth data bit region D4 is moved to a fifth adjoining data bit region D5 by a motion current. FIG. 6 is a schematic graph illustrating a magnetic domain motion current PULSE 1, a reading pulse current PULSE 2 (READING) and a writing switching current PULSE 2 (WRITING) applied to a magnetic memory device 10 according to an example embodiment.

A data writing operation according to an example embodiment may be performed as follows. When a switching current is applied to a fourth data bit region D4 as illustrated in FIG. 4A, a perpendicular magnetization direction of the fourth data bit region D4 may be reversed as illustrated in FIG. 4B. When a motion current is applied to the recording layer 11, perpendicular magnetization directions of respective data bit regions may be moved to adjoining data bit regions, respectively, as illustrated in FIG. 4C. For example, the perpendicular magnetization directions of first to eighth data bit regions D1, D2, D3, D4, D5, D6, D7 and D8 of the data storage cell 20 illustrated in FIG. 4B, may be moved by one data bit region to the second to eighth data bit regions D2, D3, D4, D5, D6, D7, D8 and a first data bit region B1 of a second portion B of the buffer cell 30, respectively, as illustrated in FIG. 4C.

As described above, the perpendicular magnetization direction of the data bit region 21 may be designated, and data (perpendicular magnetization direction) of the data bit region 21 may be moved to the adjoining data bit region (e.g., a fifth data bit region D5) after a first time period elapses. A writing signal may be input again to the data bit region 21 to designate a perpendicular magnetization direction. Using a periodically applied motion current and a writing switching signal periodically applied in synchronization with the motion current, designating process of the perpendicular magnetization direction and the motion process may be performed in turns (or alternately) so that multi-bit data (e.g., a plurality of data bits) may be recorded in an array of the plurality of data bit regions of the recording layer 11. When the data recording operation is complete, a moved data storage position may be maintained or a motion signal moving the magnetic domains in the opposite direction may be input so that data in the first to eighth data bit regions D1, D2, D3, D4, D5, D6, D7 and D8 of the data storage cell 20 may be stored.

The stored data reading operation may be performed in the following manner. Referring to FIG. 5A, a reading current may be applied to the fourth data bit region D4 to read data stored in the fourth data bit region D4. When a motion current is applied to the recording layer 11 as illustrated in FIG. 5B, magnetization directions of respective data bit regions may be moved to adjoining data bit regions, respectively. For example, perpendicular magnetization directions of the first to eighth data bit regions D1, D2, D3, D4, D5, D6, D7 and D8 of the data storage cell 20 illustrated in FIG. 5A may be moved by one data bit region to the second to eighth data bit regions D2, D3, D4, D5, D6, D7, D8 and the first data bit region B1 of the second portion B of the buffer cell 30, respectively, as illustrated in FIG. 5B.

As described above, the perpendicular magnetization direction of the data bit region 21 may be read, and data (perpendicular magnetization direction) of the data bit region 21 may be moved to the adjoining data bit region (e.g., the fifth data bit region D5), after a first time period elapses. A reading signal may be input again to the data bit region 21 to perform a data reading operation. Using a periodically applied motion current and a reading switching signal pulse current periodically applied in synchronization with the motion current illustrated in FIG. 6, the reading process and the motion process may be performed in turns (or alternately) until reading of a plurality of data bits stored on the recording layer 11 is complete. When the data reading operation is complete, a moved data storage position may be maintained or a motion signal moving the magnetic domains in the opposite direction may be input to maintain data originally stored in the first to sixth data bit regions D1, D2, D3, D4, D5, D6, D7 and D8 of the data storage cell 20.

According to at least some example embodiments, during the reading operation, the reading pulse current may be periodically applied in synchronization with a domain motion signal without polarity reversion as illustrated in FIG. 6. The amount of current flowing through a tunnel barrier and resistance there from, (e.g., when the reading pulse current is applied to the reference layer 15 and the data bit region 21 of the recording layer 11) may differ depending on whether a perpendicular magnetization direction of the data bit region 21 of the recording layer 11 is 'up' or 'down'. For example, resistance when the perpendicular magnetization direction of the data bit region 21 of the recording layer 11 is 'down' is greater than the resistance when the perpendicular magnetization direction of the data bit region 21 of the recording layer 11 is 'up' in a case where a perpendicular magnetization direction of the reference layer 15 is 'up'. Data stored in the data bit region 21 may be recognized using such a resistance difference.

In the above descriptions, the magnetic memory device 10 according to at least some example embodiments may incorporate a magnetic device capable of reading a plurality of data bits (e.g., an MTJ, GMR sensor or the like) and a recording magnetic device using spin transfer torque into a single device, but example embodiments are not limited to this. For example, the magnetic memory device 10 according to an example embodiment may be used as a magnetic device (e.g., an MTJ, GMR sensor or the like) capable of reading a plurality of data bits using a magnetic domain motion, or may be also used as a recording magnetic device using spin transfer torque, capable of recording a plurality of data bits using the magnetic domain motion.

Figure 7:
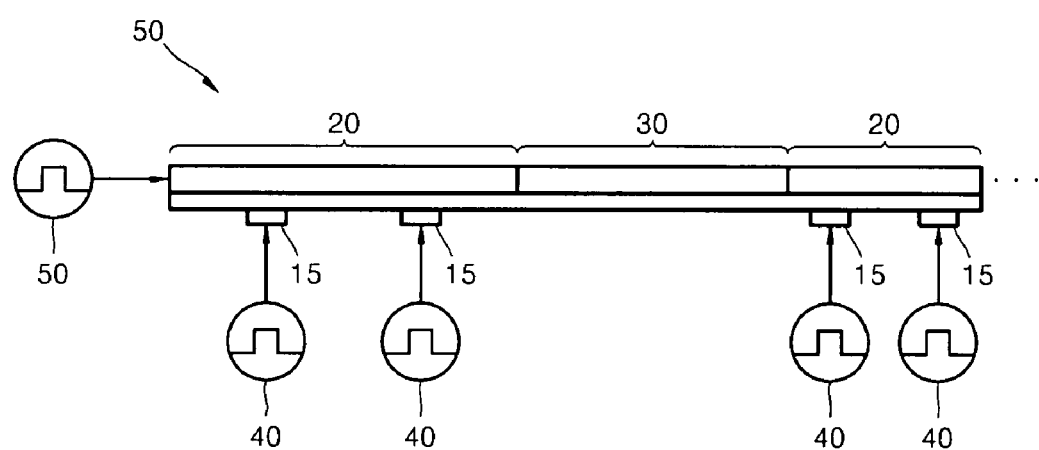
FIG. 7 is a schematic view of a magnetic memory device according to another example embodiment.

FIG. 7 is a schematic view of a magnetic memory device 100 according to another embodiment of the present invention. Referring to FIG. 7, the magnetic memory device 100 may include a plurality of data storage cells 20. In this example embodiment, the memory device 100 may further include a buffer cell 30 adjoining the data storage cell 20 to store data moved to the outside of the data storage cell 20 due to a magnetic domain motion. At least one first input portion 40 may be formed per data storage cell 20. When a plurality of data storage cells 20 are provided and at least one first input portion 40 is formed per data storage cell 20, a data storage capacity may increase by the number of data storage cells 20, and a data storing or reading speed greater than or equal to that of the magnetic memory device including a single data storage cell may be achieved.

FIG. 7 shows an example in which a buffer cell 30 may be formed between two data storage cells 20. In the structure where a plurality of data storage cells 20 are formed, buffer cells 30 may be formed in at least one position of a position located before a first data storage cell and a position located after a last data storage cell, and at a position located between two adjacent data storage cells.

The example shown in FIG. 7 illustrates two reference layers 15 and two first input portions 40 formed for one data storage cell 20. When a plurality of first input portions 40 are formed for one data storage cell 20, a data storing or reading speed may be further enhanced.

In at least one other example embodiment, a magnetic memory device 100 may have a structure such that a plurality of reference layers 15 and first input portions 40 may be formed for one data storage cell 20 and a writing signal and a reading signal may be input through different first input portions 40. The writing signal may be input into a data storage cell 20, and a reading signal may be input into another data storage cell 20.

According to example embodiments of magnetic memory devices, a recording layer having switchable (or variable) magnetic direction, a plurality of magnetic domains and/or a reference layer corresponding to a portion of the recording layer and having a pinned magnetization direction are provided. A data storage cell including an array of a plurality of data bit regions each including (or consisting of) a magnetic domain is provided. The magnetic domain may be formed on the recording layer, and may have an effective size of the reference layer. Because a data storing or reading operation and a magnetic domain motion moving data stored in a data bit region of the recording layer to an adjoining data bit region may be performed in turns (or alternately), it may be possible to store or read multi-bit data (e.g., a plurality of data bits).

Multi-bit data (e.g., a plurality of data bits) may be stored in each cell to which a magnetic memory device according to example embodiments is applied, which may increase data storage capacity.

Furthermore, in the data storage cell according to at least some example embodiments, because the recording layer is formed of an amorphous magnetic material so that the recording layer may have a perpendicular magnetization direction, a single magnetic domain per one data bit region may be formed more stably even when a size of the magnetic domain is reduced to a nanoscale size. Therefore, a magnetic domain corresponding to a data bit region having a smaller or relatively small size (e.g., a nanoscale size) may be formed (e.g., naturally formed) and/or the magnetic domain may be more stably maintained. As a result, the number of data bits that may be stored per unit length of the recording layer may be increased.

According to example embodiments described herein, a magnetic memory having a higher data storage capacity may be realized.

While the present invention has been particularly shown and described with reference to example embodiments thereof, it will be understood by those of ordinary skill in the art that various changes in form and details may be made therein without departing from the spirit and scope of the present invention as defined by the following claims.

What is claimed is:

1. A magnetic memory device comprising:
a recording layer including a plurality of magnetic domains, each of the plurality of magnetic domains having a switchable magnetization direction;
a reference layer corresponding to a portion of the recording layer, the reference layer having a pinned magnetization direction, the portion of the recording layer corresponding to the reference layer being a data storage cell for storing multi-bit data;
a first input electrically connected to at least one data bit region of the data storage cell and to the reference layer, the first input being for inputting at least one of a writing signal and a reading signal; and
a second input electrically connected to the recording layer, the second input being for inputting a magnetic domain motion signal for moving data stored in the at least one data bit region of the recording layer to another data bit region.

2. The memory device of claim 1, wherein the recording layer has a perpendicular magnetization direction.

3. The memory device of claim 1, wherein the recording layer is a magnetic domain strip formed of an amorphous magnetic material having a perpendicular magnetization direction.

4. The memory device of claim 1, wherein the recording layer includes an alloy of a rare earth element-transition metal.

5. The memory device of claim 4, wherein a rare earth element used for forming the recording layer is at least one selected from the group consisting of Th, Gd and Eu.

6. The memory device of claim 5, wherein a transition metal used for forming the recording layer is at least one selected from the group consisting of Co, Fe, Mn and Ni.

7. The memory device of claim 4, wherein a transition metal used for forming the recording layer is at least one selected from the group consisting of Co, Fe, Mn and Ni.

8. The memory device of claim 1, wherein at least one of the recording layer and the reference layer are formed of TbFeCo.

9. The memory device of claim 8, wherein at least one of the recording layer and the reference layer has a composition ratio of $Tb_{20}Fe_{70}Co_{10}$, $Tb_{23}Fe_{67}Co_{10}$, $Tb_{18}Fe_{72}Co_{10}$ or $Tb_{16}Fe_{74}Co_{10}$.

10. The memory device of claim 8, wherein the recording layer has a composition ratio of $Tb_{20}Fe_{70}Co_{10}$, $Tb_{23}Fe_{67}Co_{10}$ or $Tb_{16}Fe_{74}Co_{10}$.

11. The memory device of claim 8, wherein the reference layer has a composition ratio of $Tb_{18}Fe_{72}Co_{10}$.

12. The memory device of claim 1, wherein the reference layer is formed to have a higher coercive force as compared to the recording layer.

13. The memory device of claim 1, wherein the reference layer has one of a perpendicular magnetization direction and an in-plane magnetization direction.

14. The memory device of claim 1, wherein the reference layer is formed of the same material as that of the recording layer.

15. The memory device of claim 1, wherein the data bit region includes a single magnetic domain.

16. The memory device of claim 1, further including,
a non-magnetic layer arranged between the reference layer and the recording layer.

17. The memory device of claim 16, wherein the non-magnetic layer is a conduction layer.

18. The memory device of claim 16, wherein the non-magnetic layer is an insulation layer serving as a tunneling barrier.

19. The memory device of claim 1, wherein the writing signal is a pulse type switching current.

20. The memory device of claim 19, wherein the reading signal is a pulse current smaller than the switching current.

21. The memory device of claim 1, wherein the inputting of one of the writing signal and the reading signal, and the inputting of the magnetic domain motion signal are performed alternately, so that a data storing or reading operation and a magnetic domain motion operation are performed alternately.

22. The memory device of claim 21, wherein the magnetic domain motion is performed by a unit of a data bit region.

23. The memory device of claim 1, wherein a magnetic domain motion is performed by a unit of a data bit region, and a data storing or reading operation and a magnetic domain motion operation are performed alternately.

24. The memory device of claim 1, further including, a buffer cell located on at least one side of the data storage cell and adjacent to the data storage cell, the buffer cell being configured to store data moved to the outside of a region of the data storage cell due to a magnetic domain motion.

25. The memory device of claim 24, wherein a plurality of data storage cells are formed, and the buffer cell is located between two adjacent data storage cells, and at least one first input portion is formed per data storage cell.

26. The memory device of claim 1, wherein a plurality of data storage cells are formed in an array and at least one first input portion is formed per data storage cell.

27. A method for storing multi-bit data in the magnetic memory device of claim 1, the method comprising:
designating a reference magnetization direction of a first portion of the recording layer in which to store data in response to the writing signal input to the reference layer and the recording layer, the first portion of the recording layer corresponding to the reference layer; and
storing bit data in the first portion of the recording layer by reversing or maintaining a magnetization direction of the first portion of the recording layer based on the writing signal.

28. The method of claim 27, wherein the magnetization direction is reversed using spin transfer torque.

29. The method of claim 27, wherein the reference magnetization direction is perpendicular or parallel.

30. The method of claim 27, further comprising:
moving the stored data to a second portion of the recording layer in response to the magnetic domain motion signal, the second portion being adjacent to the first portion; and
storing bit data in the first portion of the recording layer by reversing or maintaining the magnetization direction of the first portion of the recording layer based on the writing signal.

31. A method for reading multi-bit data from the magnetic memory device of claim 1, the method comprising:

applying the reading signal to the reference layer and the recording layer;

reading bit data stored in a portion of the recording layer based on a change in magnetization direction of the portion of the recording layer in response to the applied reading signal.

32. The method of claim 31, wherein the portion of the recording layer is located at a portion of the recording layer corresponding to the location of the reference layer.

33. The method of claim 31, wherein the reading signal is a pulse current.

* * * * *